United States Patent [19]

Capasso et al.

[11] Patent Number: 5,457,709
[45] Date of Patent: Oct. 10, 1995

[54] UNIPOLAR SEMICONDUCTOR LASER

[75] Inventors: Federico Capasso, Westfield; Alfred Y. Cho, Summit; Jerome Faist, Scotch Plains; Albert L. Hutchinson, Piscataway; Serge Luryi, Bridgewater; Carlo Sirtori, Summit; Deborah L. Sivco, Warren, all of N.J.

[73] Assignee: AT&T IPM Corp., Coral Gables, Fla.

[21] Appl. No.: 223,341

[22] Filed: Apr. 4, 1994

[51] Int. Cl.⁶ .................................................. H01S 3/19
[52] U.S. Cl. .................................... 372/45; 372/43
[58] Field of Search ................................ 372/43, 44, 45, 372/46

[56] References Cited

U.S. PATENT DOCUMENTS 5,311,009  5/1994  Capasso et al. .................. 250/214 LS

OTHER PUBLICATIONS

"Possibility of the Amplification of Electromagnetic Waves in a Semiconductor with a Superlattice", by R. F. Kazarinov et al., *Soviet Physics–Semiconductors*, vol. 5, No. 4, Oct., 1971, pp. 707–709.

"Evaluation of the Feasibility of a Far–infrared Laser Based on Intersubband Trransitions in GaAs Quantum Wells", by S. I. Borenstain, *Applied Physics Letters*, vol. 55 (7), 14 Aug. 1989, pp. 654–656.

"Feasibility of Far–infrared Lasers Using multiple Semiconductor Quantum Wells," by Q. Hu, *Applied Physics Letters*, vol. 59(23), 2 Dec. 1991, pp. 2923–2925.

"Possibility of Infrared Laser in a Resonant Tunneling Structure," by A. Kastalsky et al., *Applied Physics Letters*, vol. 59 (21), 18 Nov. 1991, pp. 2636–2638.

"Carrier Transport and Intersubband Population Inversion in Coupled Quantum Wells", W. M. Yee et al., *Applied Physics Letters*, vol. 63 (8), 23 Aug. 1993, pp. 1089–1091.

"Periodic Negative Conductance by Sequential Resonant Tunneling Through an Expanding High–field Superlattice Domain", by K. K. Choi et al., *Physical Review, B*, vol. 35, No. 8, 15 Mar. 1987–I, pp. 4172–4175.

"Band Nonparabolicity Effects in Semiconductor Quantum Wells," by D. F. Nelson et al., *Physical Review B*, vol. 35, No. 14, 15 May 1987, pp. 7770–7773.

"Quantum–well Intersub–band Electroluminescent Diode at $\lambda=5\mu m$," by J. Faist et al., *Electronics Letters*, vol. 29, No. 25, 9 Dec. 1993, pp. 2230–2231.

"Phonon Limited Intersubband Lifetimes and Linewidths in a Two–dimensional Electron Gas," by J. Faist, *Applied Physics Letters*, vol. 64 (7), 14 Feb. 1984, pp. 872–874.

"Pseudo–quaternary GaInAsP Semiconductors: A new $Ga_{0.47}In_{0.53}As/InP$ Graded Gap Superlattice and its Applications to Avalanche Photodiodes", by F. Capasso, *Applied Physics Letters*, vol. 45 (11), 1 Dec. 1984, pp. 1193–1195.

(List continued on next page.)

*Primary Examiner*—James W. Davie
*Attorney, Agent, or Firm*—Eugen E. Pacher

[57] ABSTRACT

This application discloses, to the best of our knowledge, the first unipolar laser. An exemplary embodiment of the laser was implemented in the GaInAs/AlInAs system and emits radiation of about 4.2 μm wavelength. Embodiments in other material systems are possible, and the lasers can be readily designed to emit at a predetermined wavelength in a wide spectral region. We have designated the laser the "quantum cascade" (QC) laser. The QC laser comprises a multilayer semiconductor structure that comprises a multiplicity of essentially identical undoper "active" regions, a given active region being separated from an adjoining one by a doped "energy relaxation" region. In a currently preferred embodiment each active region comprises three coupled quantum wells designed to facilitate attainment of population inversion. In the currently preferred embodiment the energy relaxation regions are digitally graded gap regions. However, other energy relaxation regions are possible. The unipolar plasma in a unipolar laser can be manipulated by means of an electric "control" field, facilitating, for instance, beam steering or external control of the modal gain of the laser. Means for accomplishing this are discussed.

20 Claims, 5 Drawing Sheets

OTHER PUBLICATIONS

"Staircase Solid–State Photomultipliers and Avalanche Photodiodes with Enhanced Ionization Rates Ratio," by F. Capasso, *IEEE Transactions on Electron Devices,* vol. ED–30, No. 4, Apr. 1983, pp. 381–390.

"Mid–infrared Field–tunable Intersubband Electroluminescence at Room Temperature by Photon–assisted Tunneling in Coupled–quantum Wells," by J. Faist, *Applied Physics Letters,* vol. 64(9), 28 Feb. 1994, pp. 1144–1146.

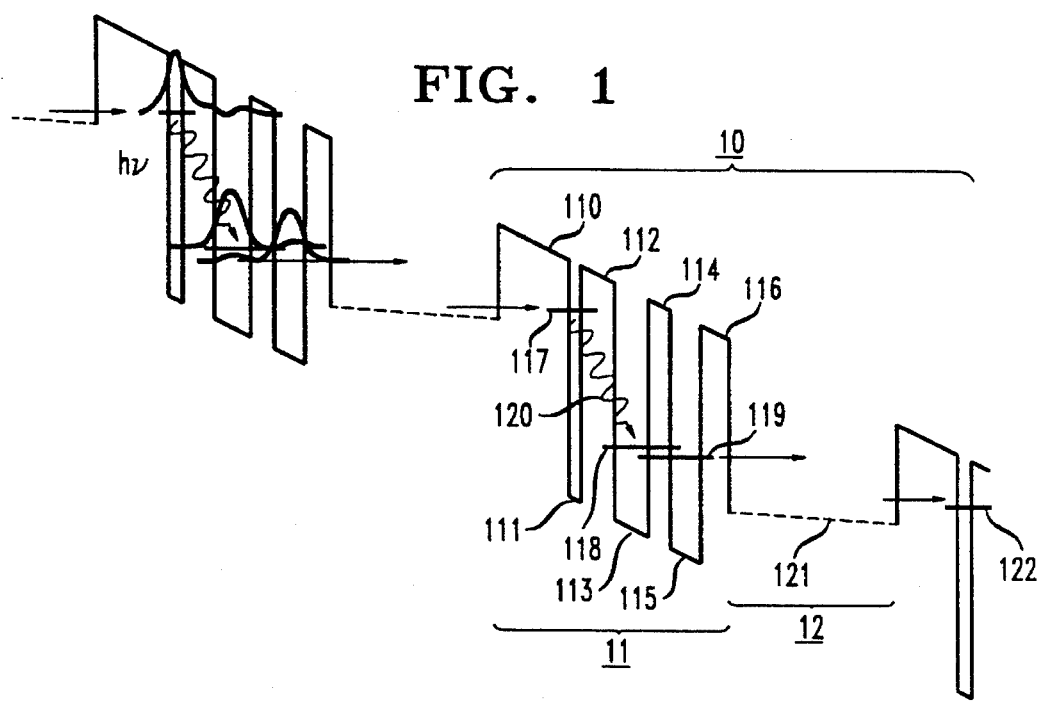
FIG. 1
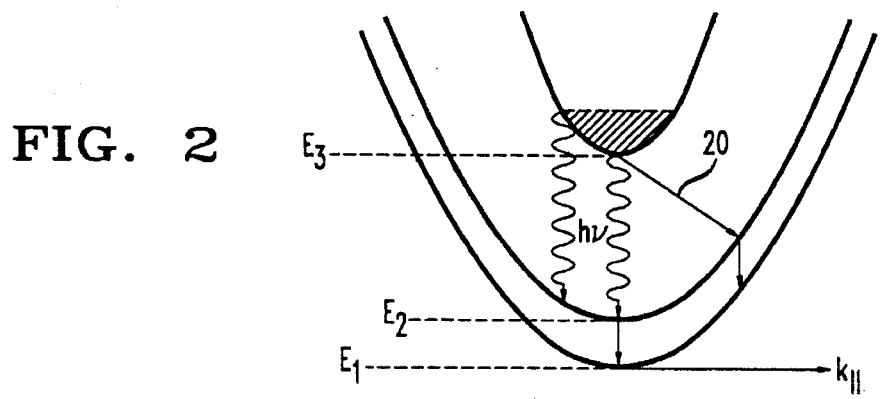
FIG. 2
FIG. 6
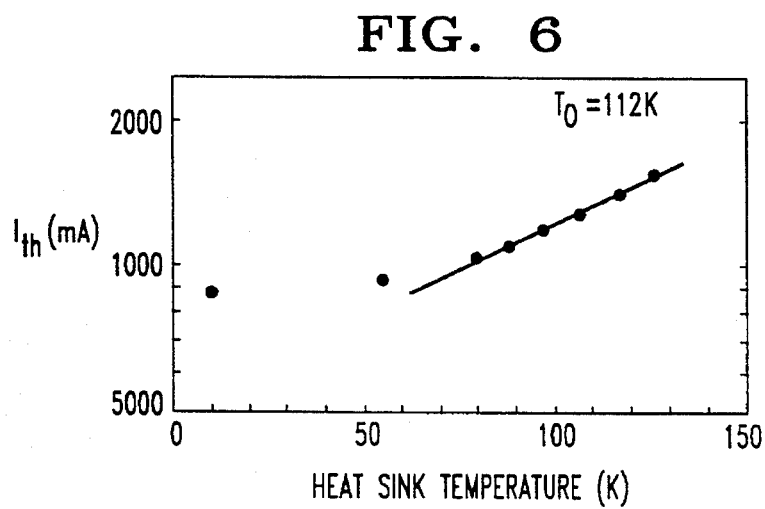

UNIPOLAR SEMICONDUCTOR LASER

FIELD OF THE INVENTION

This application pertains to the field of injection semiconductor lasers.

BACKGROUND OF THE INVENTION

R. F. Kazarinov et al. (*Soviet Physics-Semiconductors*, Vol. 5(4), p. 707 (1971)) predicted the possibility of amplification of electromagnetic waves in a semiconductor superlattice structure. Since the publication of this seminal paper, the feasibility of a unipolar quantum well semiconductor laser has been considered by many workers in the field. See, for instance, S. J. Borenstain et al., *Applied Physics Letters*, Vol. 55(7), p. 654 (1989); Q. Hu et al., *Applied Physics Letters*, Vol. 59(23), p. 2923 (1991); A. Kastalsky et al., *Applied Physics Letters*, Vol. 59(21), p. 2636 (1991); and W. M. Yee et al., *Applied Physics Letters*, Vol. 63(8), p. 1089 (1993). However, to the best of our knowledge, the prior art does not disclose observation of lasing in any of the proposed unipolar structures.

Those skilled in the art are aware of the advantages potentially offered by some types of unipolar injection laser. Among these are a frequency response that is not limited by electron/hole recombination, a narrow emission line because the line-width enhancement factor is (theoretically) zero, and a weaker temperature dependence of the lasing threshold than in conventional (i.e., bipolar) semiconductor lasers. Furthermore, appropriately designed unipolar semiconductor lasers can have an emission wavelength in the spectral region from the mid-infrared (mid-IR) to the submillimeter region, exemplarily in the approximate range 3–100 µm, that is entirely determined by quantum confinement. The emission wavelength can be tailored using the same heterostructure material over the above mentioned wide spectral region, a portion of the spectrum not easily accessible with diode semiconductor lasers. Furthermore, unipolar lasers can use relatively wide bandgap, technologically mature materials (e.g., utilize GaAs- or InP-based heterostructures), without reliance on temperature sensitive and difficult to process small bandgap semiconductors such as PbSnTe. Such unipolar lasers could, for instance, be advantageously used for pollution monitoring, industrial process control and automotive applications.

Prior art proposals for unipolar quantum well semiconductor lasers typically involve use of resonant tunneling structures. For instance, W. M. Yee et al., (op. cit.) analyzed two coupled quantum well structures, each of which contains an emission quantum well sandwiched between energy filter wells, the coupled quantum well assembly sandwiched between n-doped injector/collector regions. The energy filter wells, respectively, have only one quasibound state ($E_1$ and $E_3$, respectively), and the emission quantum well has more than one quasibound state, with intersubband transitions taking place between two of the states ($E_2^{(2)}$ and $E_2^{(1)}$). When, by means of an applied electric field, $E_1$ becomes substantially aligned with $E_2^{(2)}$, electrons from the injector can resonantly populate $E_2^{(2)}$. If, at the same applied field, $E_3$ is substantially aligned with $E_2^{(1)}$ then the latter can be resonantly depleted into the collector. If the time constant for the former process is longer than the time constant for the latter then a population inversion in the emission quantum well could, at least in principle, be achieved.

As those skilled in the art will appreciate, the optical output power obtainable from a structure of the type analyzed by Yee et at., (i.e., a structure that comprises a single set of coupled quantum wells) is typically too small to be of practical interest. In principle this shortcoming can be remedied by provision of a structure that comprises a multiplicity of said sets. However, it is known that, for fundamental reasons, lasing typically cannot be achieved in such a structure. For instance, application of a voltage across such a multi-quantum well structure that comprises doped regions will typically result in a non-uniform field in the device, with attendant negative resistance and instability. See, for instance, K. K. Choi et al., *Physical Review B*, Vol. 35 (8), p. 4172 (1987).

In view of the considerable potential commercial and scientific value of a unipolar semiconductor laser, especially one that can be designed to emit in the mid-IR spectral region, such a laser would be of substantial interest. This application discloses such a laser, to be referred to as the quantum cascade (QC) laser.

SUMMARY OF THE INVENTION

In a broad aspect this application discloses a unipolar semiconductor injection laser. More specifically, the instant invention is embodied in an article that comprises a unipolar semiconductor (typically III–V semiconductor) laser that comprises a multilayer semiconductor structure containing doped semiconductor material of only a first conductivity type (typically n-type), and means for applying a voltage (including a normal operating voltage ) across said multilayer semiconductor structure.

Significantly, the multilayer structure comprises a multiplicity (e.g., ten or more) of essentially identical (i.e., exhibiting at most only substantially unavoidable minor differences) "active" regions, a given one of said active regions being separated from an adjoining active region by an "energy relaxation" region. Each of said active regions comprises two or more coupled quantum wells. Associated with said at least two coupled quantum wells are at least two (but preferably three or more) energy states, said at least two (or three) energy states to be referred to, respectively as third and second (or third, second and first) energy states. The third energy state is at a higher energy than the second energy state, which in turn is (under appropriate bias) at a higher energy than the first energy state. The third, second and first energy states will also be referred to as the n=3, 2 and 1 states, respectively. Associated with said first, second and third energy states are, respectively, first, second and third wavefunctions. A wavefunction is "associated" with an energy state in a well if the centroid of the modulus square of the wavefunction is located in the well.

An important aspect of preferred embodiments of the QC laser is selection of the active region such that there is provided reduced spatial overlap between said third and second wavefunctions in a given active region. By "reduced spatial overlap" we mean herein overlap that is less than the overlap between the wavefunctions of states $E_2^{(2)}$ and $E_2^{(1)}$ of QW2 of any of the two structures of FIG. 1 of W. M. Yee et al., *Applied Physics Letters*, Vol. 63(8), p. 1089. Techniques for computing the overlap between wavefunctions in quantum well structures are known to those skilled in the art and do not require exposition. See, for instance, G. Bastard, "Wave Mechanics Applied to Heterostuctures", Les Editions de Physique, Paris 1990, incorporated herein by reference. See also D. F. Nelson et al., *Physical Review B*, Vol. 35 (14), p. 7770 (1987). At least some (desirably substantially all) of the charge carriers undergo a radiative transition from the third to the second energy state.

The energy relaxation regions are selected to be thick enough to provide substantial energy relaxation and randomization of motion of charge carriers of the given conductivity type in a given graded energy relaxation region when a normal operating voltage is applied. Differently stated, and with reference to FIG. 1, the thickness of a given energy relaxation layer 12 is selected to facilitate relaxation of charge carriers from the energy of the n=1 energy state 119 to the energy of the n=3 energy state 122 of the next active region, such that the carriers can tunnel into the n=3 state 122 of the next active layer. Exemplarily, the thickness is 1–2 $\lambda_E$, where $\lambda_E$ is the energy mean free path of the carriers in the energy relaxation region. At least some of the charge carriers are introduced into the given energy relaxation region by tunneling from said first energy state through a barrier layer. Typically, the active regions are at most lightly doped (exemplarily less than about $2-3 \times 10^{16}$ cm$^{-3}$) and preferably undoped (not intentionally doped), and the graded gap regions are doped (desirably not greatly exceeding about $10^{17}$ cm$^{-3}$, to minimize free carrier absorption) to exhibit conductivity of the given type, typically n-type. The energy relaxation region can be continuously (analog) or stepwise graded, but in currently preferred embodiments is digitally graded.

A further significant aspect of the layer structure is the provision of optical confinement of the lasing mode. This is accomplished by appropriate selection of layer compositions to result in a waveguide core of higher effective refractive index than that of the cladding layers.

As will be described in more detail below, the reduced overlap between the third and second energy states in preferred embodiments materially contributes to attainment of a relatively long lifetime ($\tau_{32}$) of the charge carriers in the third energy state. (The carders are provided to the third energy state by tunneling from a first adjoining energy relaxation region). The lasing-relevant transition is the photon-emitting transition from the third to the second energy state. Carriers typically are removed from the second energy state by tunneling or phonon scattering into the first energy state. Associated with the carriers in the second energy state is a lifetime $\tau_{21}$, which must be less than $\tau_{32}$, to achieve population inversion between energy levels 3 and 2. Lifetime $\tau_{32}$ can be made relatively large by appropriate choice of the wavefunction overlap, and $\tau_{21}$ can be made relatively small by, e.g., provision of an appropriately thin (e.g., less than 10 or 5 nm) barrier between the quantum wells associated with said first and second energy states. Preferably the active region is formed such that, with a normal operating voltage applied, the energy difference $\Delta E_{21}$ between second and first energy states is about $h\nu_{op}$ or larger, where h is Planck's constant and $\nu_{op}$ is the relevant optical phonon frequency. The preferred layer structure is also designed to provide, under a normal operating voltage, for tunneling of the carriers from the well associated with the first energy state into a second adjoining graded gap region.

The provision of energy relaxation regions is a significant aspect of the described embodiment of the invention, since it inter alia makes possible lasing in the multi-period structure before the appearance of negative resistance, thereby overcoming a significant shortcoming of previously proposed unipolar laser structures. The provision of reduced overlap of the third and second wavefunctions makes possible attainment of larger values of $\tau_{32}$ than are typically attainable in prior art structures, and is another significant aspect of preferred embodiments.

A still further significant aspect is the substantial absence of dopant from the active regions of the QC laser, facilitating narrowing of the luminescence spectrum, thereby increasing the peak gain. The absence of doping is to be compared with the structure disclosed by J. Faist et al., (*Electronics Letters*, Vol. 29 (25), p. 2230 (Dec. 1993)) wherein, in addition to the graded gap region, a portion of the active region is doped. The structure exhibited a broad luminescence peak and was not capable of lasing, due to the absence of waveguiding layers and the doping of a portion of the active region.

BRIEF DESCRIPTION OF THE DRAWINGS

FIG. 1 schematically depicts a portion of the conduction band diagram of an exemplary laser according to the invention;

FIG. 2 is a schematic representation of the dispersion of the n= 1, 2 and 3 energy states, respectively;

FIG. 6 shows data on threshold current vs. laser temperature for a still further laser according to the invention, indicating a value of 112K for the laser parameter $T_o$.

DETAILED DESCRIPTION OF SOME PREFERRED EMBODIMENTS

Figure 3:
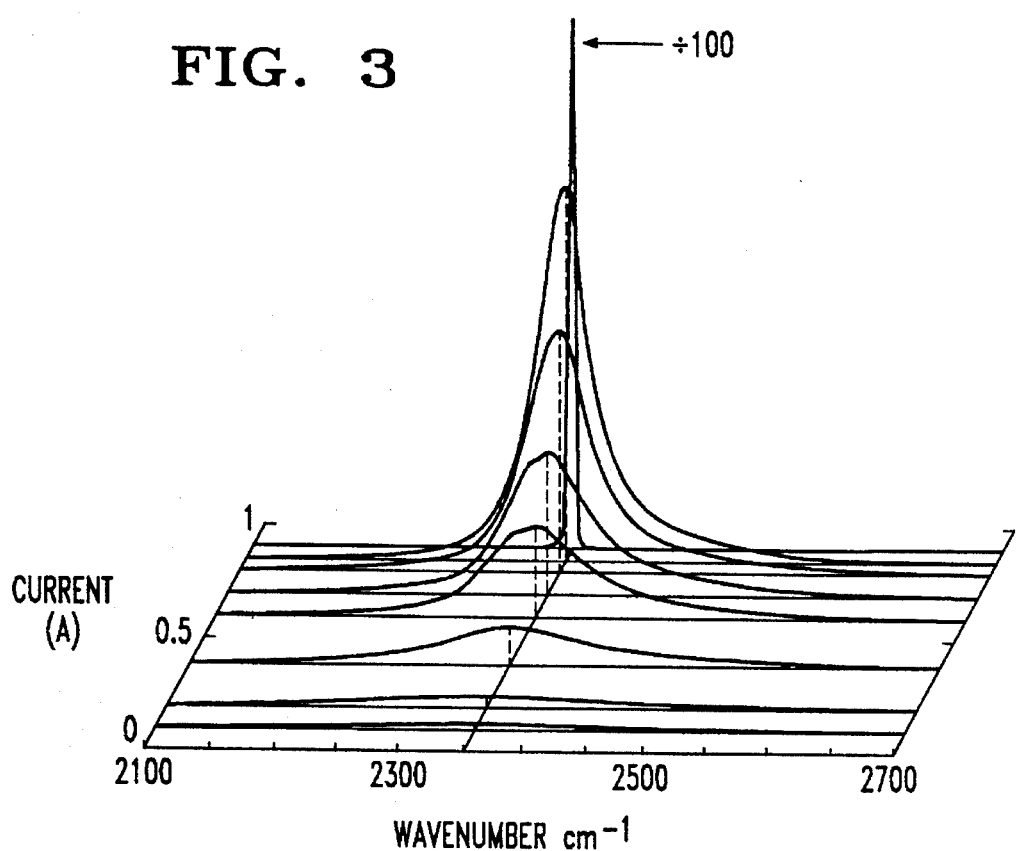
FIG. 3 shows exemplary data on the emission spectrum of a laser according to the invention, for various drive currents.

Among the difficulties that have to be overcome before a practical unipolar laser can be achieved is the following: In III–V semiconductor materials of current interest, the excited state (e.g., $E_2^{(2)}$ of FIG. 1 of Yee et al.) non-radiative lifetime ($\tau_{NR}$) typically is quite small (exemplarily about 1 ps), if the intersubband separation (e.g., $E_2^{(2)}-E_2^{(1)}$ of FIG. 1 of Yee et at.) corresponds to a wavelength less than about 40 μm. This is typically due to the possibility in these materials of non-radiative decay due to optical phonon emission, for $E_2^{(2)}-E_2^{(1)} \geq h\nu_{op}$, the optical phonon energy (typically about 30 meV). For $E_2^{(2)}-E_2^{(1)} < h\nu_{op}$, $\tau_{NR}$ is much larger, typically a few hundred picoseconds, being limited primarily by acoustic phonon scattering. J. Faist et al., *Applied Physics Letters*, Vol. 64(7), p. 872, (Feb. 1994).

Those skilled in the art will appreciate that a unipolar laser requires design features that make it possible to increase the excited state lifetime to a value substantially greater than is associated with prior art structures, such that a significant population inversion can be attained for transition energies $\geq h\nu_{op}$. Exemplarily this is achieved by means of spatial separation between the ground state and the first excited state, with the relevant quantum wells being asymmetric and strongly coupled.

FIG. 1 schematically depicts the conduction band diagram of a portion of the multilayer semiconductor structure of an exemplary unipolar laser according to the invention under positive bias conditions corresponding to an electric field of $10^5$ V/cm. The quantum wells exemplarily are Ga$_{0.47}$In$_{0.53}$As (to be referred to as "GaInAs"), and the barriers are $Al_{0.48}In_{0.52}As$"). The depicted portion comprises one period 10 of a (multiperiod) multilayer semiconductor structure, with the two adjoining periods also indicated. Each period comprises an active region 11 and an energy relaxation region 12, the former being substantially undoped (typically not intentionally doped), and the latter being doped. The energy relaxation region exemplarily is a digitally graded gap region. However, other energy relaxation regions are possible.

Electrons are tunnel injected into active region 11 through barrier 110. The active region includes coupled asymmetric quantum wells 111 and 113, separated by barrier 112. Associated with wells 111 and 113 are third energy state 117 and second energy state 118, respectively. Wavy line 120 indicates the photon-assisted tunneling transition responsible for luminescence (and lasing) in the exemplary structure. Electrons in the second energy state tunnel through barrier 114 into quantum well 115, occupying therein first energy state 119. Furthermore, electrons tunnel through barrier 116 from well 115 into energy relaxation region 12. One of the adjoining active regions shown in FIG. 1 depicts the modulus square of the wavefunction associated with the first, second and third energy states, respectively.

As can be seen from FIG. 1, the wavefunction of the n=3 state can extend into the neighboring quantum well (e.g., 113) and beyond, possibly resulting in some "leakage" of electrons out of the n=3 state. This occurs because the QC laser typically operates under a strong applied electric field. The main effect of the extension of the wavefunction into the continuum typically is a decrease of the injection efficiency, as electrons are escaping into the continuum instead of making a radiative transition. We believe that such escape can be reduced or prevented by appropriate choice of layer thicknesses, such that the layers form a Bragg reflector for the n=3 carriers (exemplarily electrons).

More specifically, it is possible to design, at least if the energy relaxation region is a digitally graded gap region, the energy relaxation region so as to behave as a Bragg mirror for the electrons at the energy of the n=3 level. Provision of an appropriately designed Bragg mirror can result in reflection of electrons back into the n=3 level, and thus prevent their escape into the continuum. Exemplarily, such Bragg reflection can be achieved if $$l_{w,j}k_w + l_{b,j}k_b = \pi, \quad (1)$$

where $l_{w,j}$ and $l_{b,j}$ are the thicknesses, respectively, of the j-th well and barrier of the digitally graded region, and $k_w$ and $k_b$ the wavevector of the electron in the n=3 energy state.

For electrons having relatively low energy, the digitally graded region behaves as a medium with an effective conduction band edge difference $\Delta E_{\mathit{eff}}$, measured with respect to the well (exemplarily GaInAs) conduction band edge, where $$\Delta E_{\mathit{eff},j} = \Delta E_c [l_{b,j}/(l_{b,j}+l_{w,j})]. \quad (2)$$

In equation 2, $\Delta E_c$ is the conduction band discontinuity between the well and barrier materials. Selecting $\Delta E_{\mathit{eff},j}$ of the j-th well/barrier pair of the digitally graded region such that the conduction band edge of the region is substantially flat under the electric field designed for lasing (which is close to the value required for the "flat band" condition in the graded region), and using equations (1) and (2), one can ensure enhanced electron confinement in the n=3 state while allowing simultaneous transport through the digitally graded region of the electrons that did relax inside the active region.

Whereas a Bragg reflector is an optional feature of QC lasers that have the n=3 and n=2 states associated with different quantum wells, it is considered to be a necessary feature for lasers that have the n=3 and n=2 states associated with one and the same quantum well.

Exemplarily, the active region 11 contains, going from higher to lower layer in the layer sequence, the following sequence of undoped layers: 4.5 nm barrier 110, 0.8 nm well 111, 3.5 nm barrier 112, 3.5 nm well 113, 3.0 nm barrier 114, 2.8 nm well 115, and 3.0 nm barrier 116.

For clarity's sake, FIG. 1 does not show the conduction band edge of digitally graded gap region 12, only the effective band edge 121 associated with the region. The graded gap region exemplarily consist of an AlInAs/GaInAs superlattice with constant period that is shorter than the electron thermal de Broglie wavelength (exemplarily of order 30 nm) in the material, and varying duty cycle to obtain a graded gap pseudoquaternary alloy. See, for instance, F. Capasso et al., *Applied Physics Letters*, Vol. 45(11), p. 1193 (1984). Exemplarily the graded gap region consists of the following n-doped (e.g., $1.5 \times 10^{17}$ cm$^{-3}$ Si) layer sequence, arranged to give an effective gap that varies from lower to higher values in going from left to right in FIG. 1: 1.8 nm well/1.2 nm barrier; 1.6/1.4 nm; 1.3/1.7 nm; 1.1/1.9 nm; 0.9/2.1 nm; 0.7/2.3 nm; 0.6 nm well.

As disclosed above, FIG. 1 pertains to the case of a QC laser with digitally graded gap energy relaxation region, and with an applied bias electric field of about $10^5$ V/cm, sufficient to provide an electric field that approximately equals the opposing quasi-electric field associated with the conduction band grading, thus resulting in a substantially staircase-shaped conduction band edge. Those skilled in the art will appreciate that, in the absence of an applied bias, the band diagram of the structure has an overall sawtooth shape. See, for instance, Capasso et al., *IEEE Transactions on Electron Devices*, Vol. ED 30(4), p. 381 (1983).

We have carried out calculations which show that, at the depicted substantially "flat band" condition, graded gap energy relaxation regions 12 are quasi-neutral. Electrons relax in the energy relaxation regions and are injected by tunneling into the n=3 excited state (the third energy state). The tunneling rate through trapezoidal barrier 110 is extremely high, exemplarily about 5 ps$^{-1}$, ensuring efficient filling of the n=3 level. The electronic states of the $Al_{0.48}In_{0.52}As/Ga_{0.47}In_{0.53}As$ coupled well structure of FIG. 1 were calculated in the envelope function approximation for various electric fields. The material parameters used are: $\Delta E_c$ (conduction band discontinuity)= 0.52eV, $m_e^*$(GaInAs)= 0.043 $m_o$, $m_e^*$(AlInAs)=0.078 $m_o$, where $m_o$ is the free electron mass. For the nonparabolicity coefficient we used $\gamma=1.13 \times 10^{-18}$m$^2$. Nonparabolicities were taken into account using the method of D. F. Nelson et at. (op. cit.).

FIG. 2 is a schematic representation of the dispersion of the n= 1, 2, 3 energy states parallel to the layers of the multilayer structure, with $k_\parallel$ being the corresponding wavevector component. The bottom of the subbands correspond to the first, second and third energy states. The subbands are nearly parallel, due to the small non-parabolicities of $k_\parallel$ not too far (typically $\leq 10$ meV) from the bottom ($k_\parallel = 0$) and for not too large transition energies. As a result, electrons making radiative transitions to a lower subband (e.g., from n=3 to n=2) will all emit photons of essentially the same energy. The joint density of states of these transitions is therefore substantially delta function-like (in the absence of broadening). If a population inversion is created between the n=3 and n=2 states then the gain spectrum of the transition will be correspondingly narrow (collision limited), nearly symmetric, and typically much less sensitive to thermal broadening of the electron distribution than that associated with interband transitions in semiconductor diode lasers. Numeral 20 refers to the optical phonon-assisted transition from the n=3 level to the n=2 level. This process, in structures according to the invention, is between states of reduced wavefunction overlap and is accompanied by a large momentum transfer. Consequently, the relevant relaxation time ($\tau_{32}$) can be relatively long, estimated about 4.3 ps at a bias of $10^5$ V/cm in the above described embodiment. This can ensure population inversion between the n=3 and n=2 shares, since the n=2 state empties into the n=1 state with a relaxation time estimated to be about 0.6 ps. This efficient relaxation is provided by quantum well 115. Strong inelastic relaxation via optical phonons with nearly zero momentum transfer occurs between strongly overlapped and closely spaced n=2 and n=1 subbands, as shown in FIG. 2. Finally, the tunneling escape time out of the n=1 state into the adjoining energy relaxation region typically is extremely short, exemplarily less than about 0.5 ps. This further facilitates population inversion.

The above described structure also facilitates injection into the excited state $E_3$ by reducing the tunneling escape probability into the continuum. The estimated escape time $\tau_{esc}$ is 6 ps, which leads to an injection efficiency $\eta_{in}=\tau_{esc}/(\tau_{esc}+\tau_{32})\cong 0.6$. The radiative efficiency of the n=3 to n=2 laser transition is estimated to be $\tau_{32}/\tau_R \approx 3\times10^{-4}$ at a field $\sim 10^5$ V/cm, where $\tau_R$ is the spontaneous emission lifetime, estimated to be about 13 ns. Calculations show that the product of $|z_{32}|^2 \tau_{32}$ (where $z_{32}=1.5$ nm is the n=3 to n=2 transition matrix element) is weakly dependent on the electric field. The low or substantially zero doping level in the active region strongly reduces the linewidth of the n=3 to n=2 electroluminescence, as compared to more highly doped coupled wells, thus enhancing the peak material gain for the same radiative efficiency. Electric field tunable electroluminescence, up to room temperature, has recently been observed by us in similar AlInAs/GaInAs coupled-quantum-well heterostructures.

We have incorporated a multiplicity of the above described active region/energy relaxation region units into a waveguide structure. The resulting unipolar device lased at a wavelength of about 4.2 μm. To the best of our knowledge, this is the first observation of laser action in a unipolar quantum well semiconductor structure.

Figure 7:
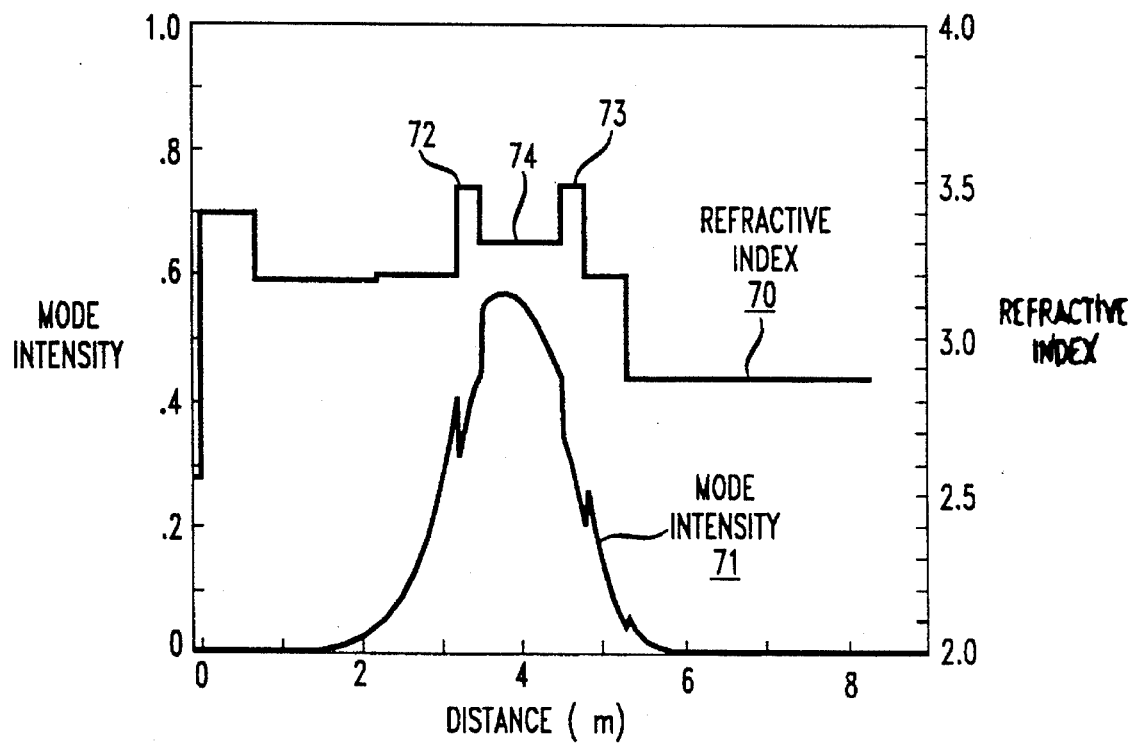
FIG. 7 shows refractive index profile and mode intensity of an exemplary QC laser.

Table 1 shows the layer sequence of an exemplary laser according to the invention. The 33.2 nm digitally graded region corresponds to below-defined "digital grating II", followed by below-defined "digital grating I", with the latter being above the former in the sequence of Table 1. The active region/digitally graded energy relaxation region sequence was repeated 25 times. Each unit of the sequence consisted of an undoped active region (3.0 nm barrier/2.8 nm well; 3.5 nm/3.5 nm; 3.5 nm 0.8 nm; 4.5 nm barrier) and one n-type ($1.5\times10^{17}$ cm$^{-3}$) "digital grating II". The 3.0 nm barrier corresponds to layer 110 of FIG. 1 and is, under a normal operating voltage, the most "upstream" layer of a given active region 11. The 14.6 nm digitally graded region corresponds to "digital grating I", and the 18.6 nm digitally graded region corresponds to "digital grating II". The compositions of the core and cladding regions were selected such that, at the lasing wavelength, the effective refractive index of the core region is larger than the effective indices of both the lower and upper cladding regions. The refractive index profile 70 of the layer structure is shown in FIG. 7, together with the calculated intensity profile 71 of the lasing mode. The confinement factor of the mode was calculated to be 0.496. A significant aspect of the waveguide structure that corresponds to the refractive index profile of FIG. 7 is the presence of doped ($10^{17}$ cm$^{-3}$) 300 nm GaInAs layers that correspond to retractive index regions 72 and 73, which sandwich the active region that corresponds to refractive index region 74 and which significantly enhance mode confinement by providing large refractive index steps. Those skilled in the art will appreciate that such enhancement layers are novel, being unsuitable for use in conventional diode lasers since they would introduce unacceptable loss due to interband absorption. The entire multilayer structure was grown epitaxially, by MBE, on a conventional n$^+$-doped InP wafer.

TABLE 1

|  |  | n-doping level (cm$^{-3}$) | Thickness (nm) |
|---|---|---|---|
| ↑ Contact layer ↓ | GaInAs Sn doped | $2.0\times10^{20}$ | 20.0 |
|  | GaInAs | $1.0\times10^{18}$ | 670.0 |
|  | AlGaInAs Graded | $1.0\times10^{18}$ | 30.0 |
| ↑ Waveguide cladding ↓ | AlInAs | $5.0\times10^{17}$ | 1500.0 |
|  | AlInAs | $1.5\times10^{17}$ | 1000.0 |
| ↑ Waveguide core | AlGaInAs Digitally graded | $1.5\times10^{17}$ | 18.6 |
|  | Active region | undoped | 21.1 |
| ↓ | GaInAs | $1.0\times10^{17}$ | 300.0 |
|  | AlGaInAs Digitally graded | $1.5\times10^{17}$ | 14.6 |
|  | AlGaInAs Digitally graded | $1.5\times10^{17}$ | 18.6    ↑ |
|  | Active region | undoped | 21.1    x25 |
|  | GaInAs | $1.0\times10^{17}$ | 300.0  ↓ |
|  | AlGaInAs Digitally graded | $1.5\times10^{17}$ | 33.2 |
| ↑ Waveguide cladding | AlInAs | $1.5\times10^{17}$ | 500.0 |
|  | Doped n$^+$InP substrate |  |  |

TABLE II

| Digital Grating I | |
|---|---|
| AlInAs | 1.2 nm |
| GaInAs | 6.5 nm |
| AlInAs | 1.2 nm |
| GaInAs | 4.5 nm |
| AlInAs | 1.2 nm |

TABLE III

| Digital Grating II | |
|---|---|
| GaInAs | 1.8 nm |
| AlInAs | 1.2 nm |
| GaInAs | 1.6 nm |
| AlInAs | 1.4 nm |
| GaInAs | 1.3 nm |
| AlInAs | 1.7 nm |
| GaInAs | 1.1 nm |
| AlInAs | 1.9 nm |
| GaInAs | 0.9 nm |
| AlInAs | 2.1 nm |
| GaInAs | 0.7 nm |
| AlInAs | 2.3 nm |
| GaInAs | 0.6 nm |

Figure 10:
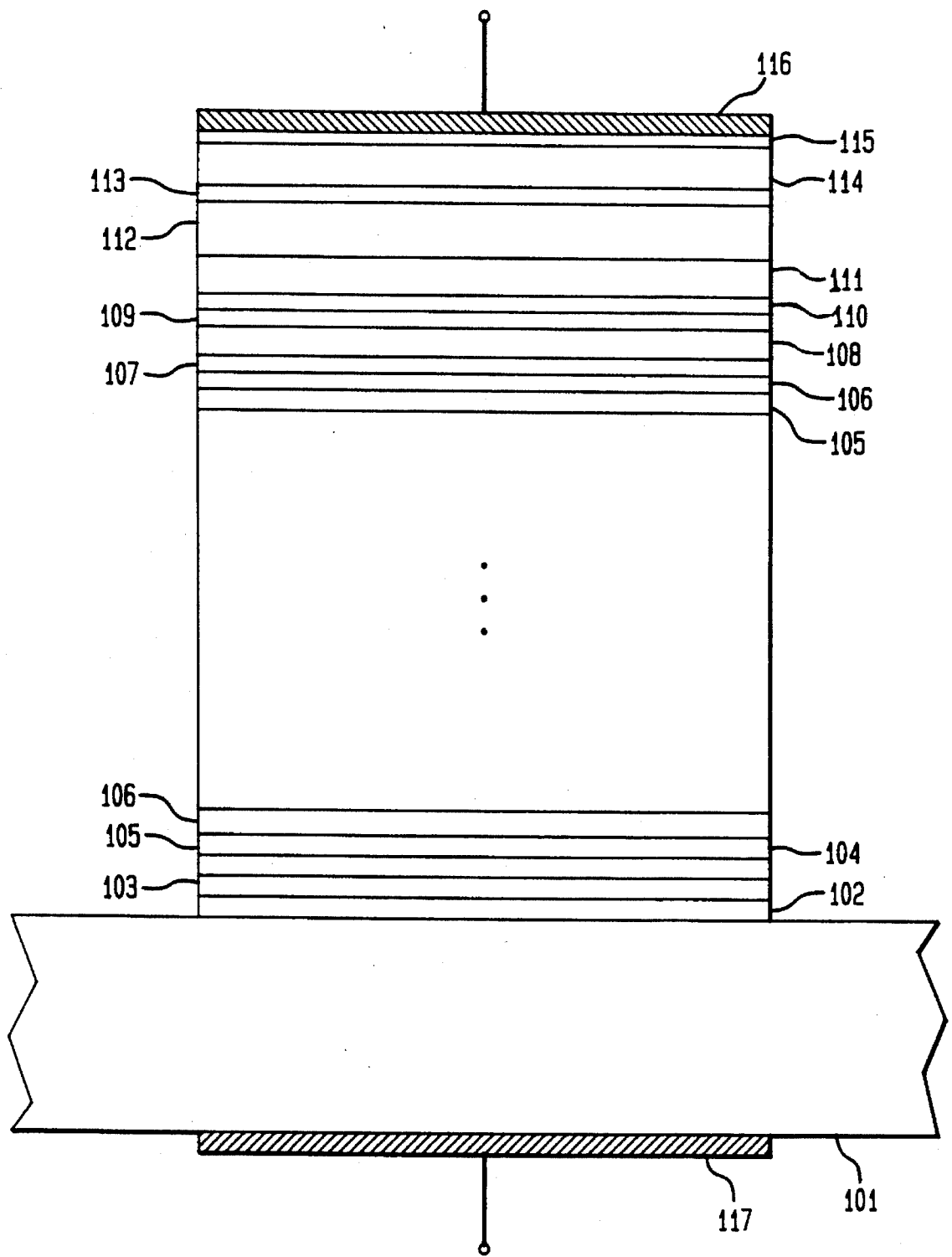
FIG. 10 schematically depicts an exemplary laser according to the invention.

The thus produced multilayer wafer was conventionally lithographically processed into mesa etched ridge waveguides of width 12 μm. The length of the waveguides (varying from 0.5 to 2.8 mm) was defined by cleaving. This also was conventional. The cleaved facets provided the reflection means that define the laser cavity. Facet reflectivity was about 0.27. Conventional ohmic contacts were provided to the top contact layer and to the substrate. An exemplary device, of length 500 µm, was soldered to a ceramic holder, mounted in a conventional flow dewar and tested by injection of 20 ns current pulses ($10^{-3}$ duty cycle) and measurement of the emission spectrum by conventional means (Nicolet Fourier transform IR spectrometer). FIG. 10 schematically depicts the above described exemplary laser according to the invention. Numerals 101–104 refer to the substrate, 500 nm AlInAs layer, 33.2 nm digitally graded layer, and 300 nm GaInAs layer, respectively. The digitally graded layer 103 consists of digital grating I above digital grating II. Numerals 105 and 106 refer to the active region and the 18.6 nm digitally graded layer (digital grating II), respectively. Layers 105 and 106 are repeated several (e.g., 25) times. Numerals 107–110 refer to the 14.6 nm digitally graded (digital grating I) layer, the second 300 nm GaInAs layer, the further 21.1 nm active region, and the further 18.6 nm digitally graded (digital grating II) layer, respectively. Numerals 111–115 refer to the 1000 nm cladding layer, the 1500 nm cladding layer, the 30 nm graded contact layer, the 670 nm GaInAs contact layer, and the 20 nm highly doped ($2\times10^{20}$ cm$^{-3}$) GaInAS contact layer, respectively. Numerals 116 and 117 refer to conventional metal contact layers. Those skilled in the art will appreciate that FIG. 10 is schematical, with some conventional features (e.g., re-growth) not shown, and that layer thicknesses and other dimensions are not drawn to scale or in proportion.

FIG. 3 shows exemplary results at 10K. Above a device current of about 850 mA, corresponding to a threshold current density of about 15 kA/cm$^2$, the signal amplitude increases abruptly by orders of magnitude, accompanied by dramatic line-narrowing. This is direct manifestation of laser action. In other QC lasers we have observed lasing at liquid nitrogen temperature, with powers approaching 20 mW for a 1.2 mm long cavity under pulsed operation. Lasing temperatures as high as 125K have been attained. Design and packaging optimization is expected to result in QC lasers capable of CW operation at even higher temperatures.

Figure 4:
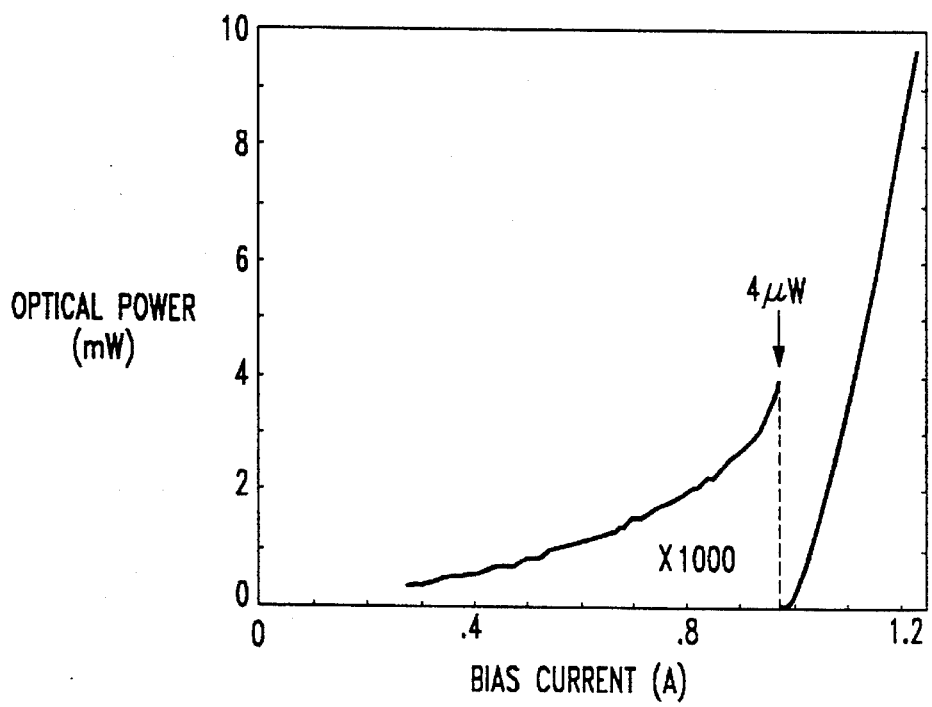
FIG. 4 provides data on optical power vs. drive current for another exemplary laser according to the spectrum.
Figure 5:
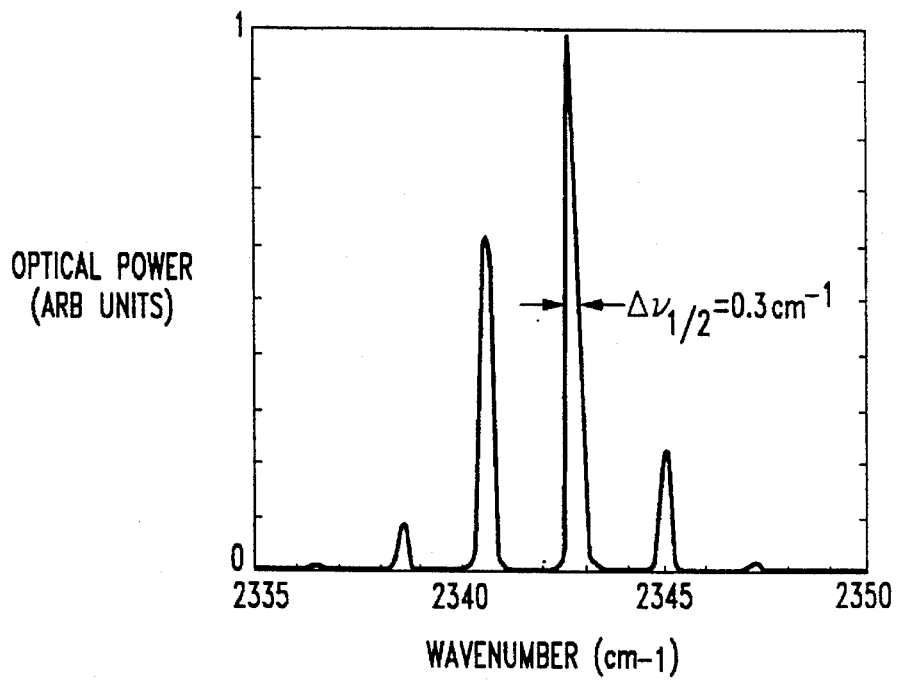
FIG. 5 shows a portion of the spectrum of FIG. 3 in high resolution.

FIG. 4 shows optical power vs. device current at 10K for a laser substantially as described, but of length 720 µm. The threshold current density is 11 kA/cm$^2$, corresponding to 8.7 V across the device, with peak optical power from a single facet of about 8.5 mW. This power was limited by the collection efficiency (40%) of the apparatus and by the divergence of the beam ($\pm40°$) normal to the layers. FIG. 5 shows a portion of the spectrum at higher resolution. Well defined, nearly equally spaced ($\Delta v = 2.175$ cm$^{-1}$) longitudinal modes were observed. The linewidth of the dominant mode was about 0.3 cm$^{-1}$, presently limited by heating effects and mode hopping during the pulse. Theory predicts, for single longitudinal mode continuous wave (cw) operation, a Schawlow-Townes linewidth with negligible linewidth enhancement factor, compared to conventional semiconductor lasers.

The laser wavelength essentially does not shift in the current range of FIG. 4, indicating that the electron density in the n=3 state is locked at the threshold value. Using measured results and estimated values of $\tau_{32}$ and $\tau_{esc}$ ($\tau_{esc}$ is the escape time from the n=3 state into the continuum), we estimate a population inversion $n_s=1.7\times10^{11}$ cm$^{-2}$, comparable to the electron density in the graded gap region.

In other experiments, we obtained from a 1.2 mm long laser an output power of 30 mW at 10K and 4 mW at 125K, and from a 2.8 mm long laser a power of 130 mW at 10K.

FIG. 6 shows data on the temperature dependence of the threshold current of a 1.2 mm QC laser. The data shows that the conventional laser parameter $T_o$ had the value 112K, indicative of deskably low temperature dependence of the threshold. The observed lasing mode was polarized normal to the layers of the multilayer structure, due to the selection rule for intersubband transitions.

Digital grading of the energy relaxation regions is not required, and conventional (continuous or discontinuous) "analog" grading is contemplated. Indeed, the energy relaxation region need not be a graded gap region, and all other means for attaining carder energy relaxation in the region between adjacent active regions are contemplated. Exemplary of such other means are a doped, relatively thick, uniform quantum well, and a superlattice region.

The former exemplarily is doped to a level of order $10^{17}$/cm$^3$, and has a thickness (e.g., 1–2 $\lambda_E$) selected to result in energy relaxation of the carriers to the bottom of the band in the region. Deskably, the composition of the quantum well (e.g., Al$_x$Ga$_{1-x}$As) is selected such that, under the bias required for lasing, the conduction band edge in the well is essentially lined up with the n=3 energy state of the adjacent (downstream) active region.

Figure 8:
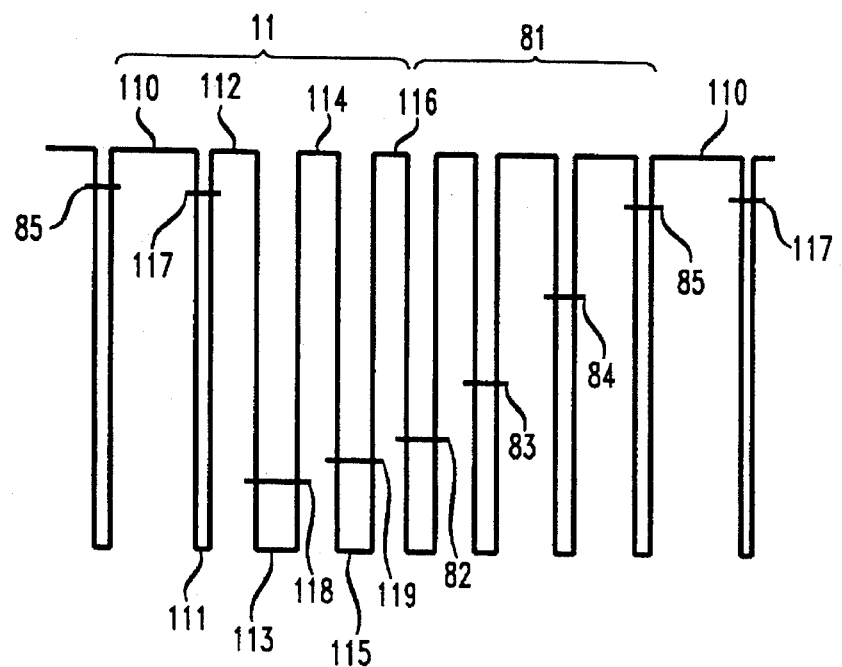
FIGS. 8 and 9 schematically illustrate an exemplary superlattice energy relaxation region.
Figure 9:
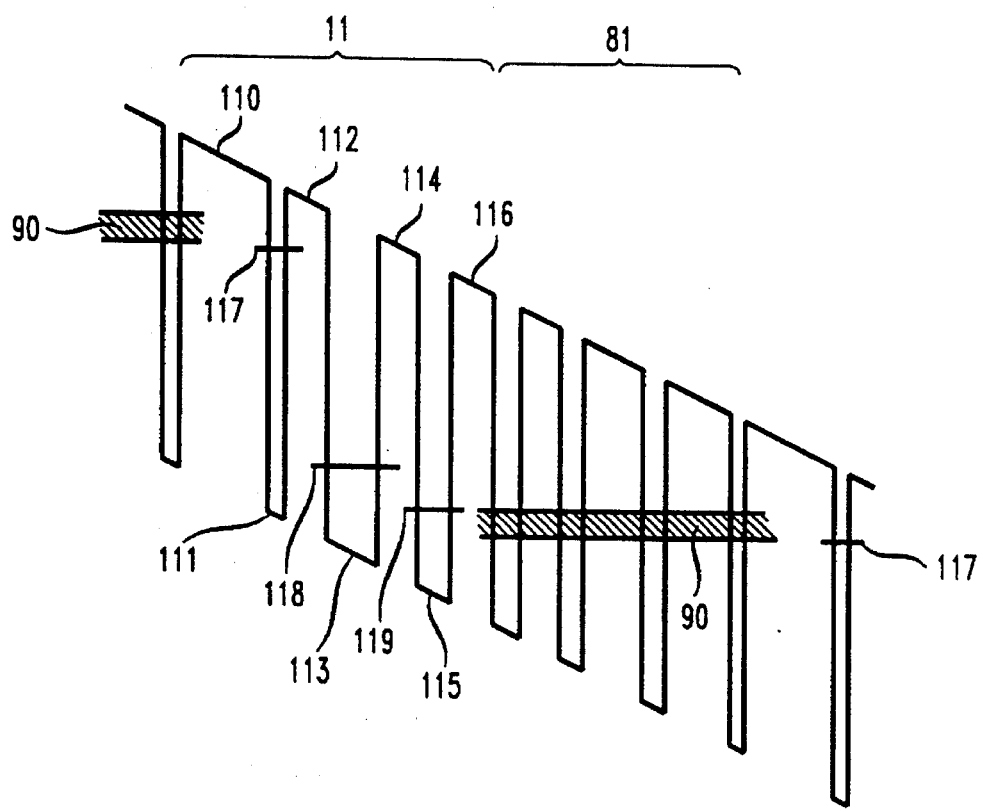

FIGS. 8 and 9 illustrate the design of an exemplary superlattice energy relaxation region, with the former showing the relevant aspects of the band structure under zero bias and the latter showing the aspects under lasing bias. Active region 11 is essentially the same as the active region of FIG. 1, and numeral 81 designates the superlattice energy relaxation region, with numerals 82–85 designating energy states. The quantum wells of the superlattice are selected such that, upon application of the lasing bias, energy states 82–85 become substantially aligned, forming miniband 90, with the miniband desirably positioned such that carriers from first energy state 119 can readily enter the miniband, and carriers can readily enter third energy state 117 of the adjacent (downstream) active region.

Still furthermore, the unipolar laser need not be n-doped but can, at least in principle, be p-doped, with the carriers preferably being the light holes to facilitate tunneling in appropriately strained layer semiconductors such as In$_x$Ga$_{1-x}$As.

QC lasers can be implemented by conventional techniques (exemplary comprising MBE) in a variety of semiconductor systems. Exemplarily of such systems are AlGaAs/InAs, InP/GaInAs, and AlInAs/GaInAs, where the first member of a pair is the barrier material, and the second member is the well material.

Quantum well structures similar to those described above (but differing therefrom inter alia with respect to doping of the active region, and lacking a waveguide structure) were recently described in the literature. J. Falst et al., *Electronics Letters*, Vol. 29 (25), p. 2230 (Dec. 1993), and J. Faist et al., *Applied Physics Letters*, Vol. 64, p. 1144, (1994), both incorporated herein by reference. These papers disclose observation of luminescence, but do not report observation of lasing. Indeed, the structures disclosed in these papers were not designed, and were unsuitable, for laser action.

Unipolar lasers have the unique property that carriers in the active region form a unipolar plasma. We have discovered that the spatial position of such a plasma can be controlled by means of an appropriate electric field, to be designated the "control" field. The ability to control the spatial position of the plasma in the laser structure makes possible, for instance, controlled steering of the laser output beam, and external control of the modal gain of the laser, i.e., control of the overlap of the optical wave cross section with the spatial profile of the gain.

In general, the electric control field will be applied such that at least a component of the control field lies in the plane of the layer structure (that is to say, in a plane normal to the direction of current flow in the layer structure). For instance, the control field can be applied in the direction perpendicular to the axis of the laser cavity by one or more sets of parallel planar conductors, possibly but not necessarily, integrated with the laser structure. Exemplarily, the planar conductors are metallic layers deposited over the sidewall dielectric.

Another contemplated approach to the application of the control field utilizes the piezo-electric property of the laser material, especially if the QC laser is implemented in III–V heterostructure materials. For instance, generation of an acoustic wave (either as a traveling or a standing wave) can result in a spatially varying electric field in the material, and thus can result in an acoustoelectric interaction between the acoustic wave and the carriers. For instance, an acoustic wave, propagating in the direction parallel to the axis of the laser cavity, can establish a periodic structure in the density of carriers (which, in turn, leads to periodic spatial structure in the optical gain and the refractive index) which can, for instance, serve as a "grating" for distributed feedback. This effect, for instance, makes it possible to vary the frequency of the lasing mode by varying the frequency of the acoustic wave.

Those skilled in the art will appreciate that the piezo-electrically generated control field need not be due to an acoustic wave but can be generated by other means, e.g., by application of static or time-varying stress.

We claim:

1. An article comprising a unipolar semiconductor laser, said laser comprising
   a) a multilayer semiconductor structure that comprises doped semiconductor material of only a first conductivity type; and
   b) means for applying a voltage across said multilayer semiconductor structure;
   characterized in that
   c) said multilayer structure comprises a multiplicity of essentially identical active regions, a given of said active regions being separated from an adjoining active region by an energy relaxation region;
   d) said active region comprises two or more coupled quantum wells, associated with said coupled quantum wells being at least second and third energy states for charge carriers of the first conductivity type, with said third energy state being higher than said second energy state, associated with said energy states being, respectively, second and third wavefunctions, said active region selected to provide reduced spatial overlap between said third and second wavefunctions;
   e) said energy relaxation region is selected to provide for substantial energy relaxation of charge carriers of the first given conductivity type in the energy relaxation region when a normal operating voltage is applied, at least some of said charge carriers being introduced into the energy relaxation region from said active region; and
   f) at least some of the charge carriers of the first conductivity type undergo a radiative transition from the third to the second energy state.

2. Article according to claim 1, wherein said active region comprises three or more coupled quantum wells, associated with said coupled quantum wells being at least first, second and third energy states for said charge carriers, with the first energy state being lower than the second energy state when said normal operating voltage is applied, associated with the first energy state is a first wavefunction; at least some of said charge carriers undergo a transition from the second to the first energy state and are introduced into the energy relaxation region from the first energy state.

3. Article according to claim 2, wherein the active region is substantially undoped, and the energy relaxation region comprises doped semiconductor material.

4. Article according to claim 3, wherein the active region is not intentionally doped, and the energy relaxation region is doped n-type.

5. Article according to claim 2, wherein the third, second and first energy states are associated with third, second and first quantum wells respectively, with an energy barrier between said first and second quantum wells, and another energy barrier between said second and third quantum wells.

6. Article according to claim 1, wherein said energy relaxation region is a digitally graded gap region comprising a multiplicity of semiconductor layers.

7. Article according to claim 6, wherein said digitally graded gap region comprises alternating layers of a first and a second semiconductor material.

8. Article according to claim 1, wherein said energy relaxation region comprises a doped continuously graded or step-wise graded gap region.

9. Article according to claim 1, wherein said energy relaxation region comprises a doped well of width sufficient to provide energy relaxation of the carriers substantially to the bottom of an energy band in the well.

10. Article according to claim 1, wherein said energy relaxation region comprises a doped superlattice region that comprises a multiplicity of quantum wells.

11. Article according to claim 6, wherein said multiplicity of semiconductor layers of the digitally graded gap region are selected to provide a Bragg reflector for charge carriers of the first conductivity type having an energy that corresponds to the third energy state.

12. Article according to claim 1, wherein the first conductivity type is n-type conductivity, and the charge carriers of the first conductivity type are electrons.

13. Article according to claim 1, wherein said multilayer semiconductor structure is selected to provide a waveguide for photons of energy corresponding to said radiative transition from the third to the second energy state.

14. Article according to claim 13, wherein said waveguide comprises a core that comprises said active region, and further comprises a doped semiconductor region having a refractive index that is higher than the refractive index of said active region.

15. Article according to claim 1, wherein the active region comprises
   i) AlGaAs and GaInAs;
   ii) InP and GaInAs; or
   iii) AlInAs and GaInAs.

16. An article according to claim 1, wherein said first energy state is lower than said second energy state by an amount greater than or equal to $hv_{op}$ when the normal-operating voltage is applied, where h is Planck's constant and $v_{op}$ is an optical phonon frequency.

17. An article comprising a unipolar semiconductor laser comprising an active region, associated with the laser is a longitudinal axis, the laser comprising
   a) a multilayer structure that comprises doped semiconductor material of only a first conducting type, associated with said multilayer structure being a plane parallel to the layers of the multilayer structure; and
   b) means for applying a voltage across said multilayer semiconductor structure such that a current can be caused to flow in a direction substantially normal to said plane parallel to the layers of the multilayer structure;

CHARACTERIZED IN THAT c) the article further comprises means for applying an electric control field to the laser such that at least a component of said control field lies in the plane parallel to the layers of the multilayer structure.

18. An article according to claim 17, wherein the means of c) comprise at least one pair of substantially parallel planar conductors disposed substantially perpendicularly to the plane parallel to the layers of the multilayer structure.

19. An article according to claim 17, wherein the means of c) comprise a transducer for generating an acoustic wave in the laser such that a spatially varying control field results.

20. An article according to claim 17, wherein the means of c) comprise means for applying stress to the laser.

* * * * *